United States Patent [19]

Polak

[11] 4,337,279
[45] Jun. 29, 1982

[54] METHOD FOR INCREASING THE PEEL STRENGTH OF METAL-CLAD POLYMERS

[75] Inventor: Anthony J. Polak, Wauconda, Ill.

[73] Assignee: UOP Inc., Des Plaines, Ill.

[21] Appl. No.: 228,019

[22] Filed: Jan. 23, 1981

[51] Int. Cl.$^3$ .............................................. B05D 3/06
[52] U.S. Cl. ...................................... 427/40; 427/304; 427/322; 204/159.15; 204/159.22; 428/461; 428/462
[58] Field of Search ......................... 427/40, 304, 322; 204/159.15, 159.22; 428/461, 462

[56] References Cited

U.S. PATENT DOCUMENTS

| | | | |
|---|---|---|---|
| 3,560,241 | 2/1971 | Davis et al. | 427/304 |
| 3,801,368 | 4/1974 | Fusayama et al. | 427/132 X |
| 3,914,521 | 10/1975 | Beatty et al. | 427/40 X |
| 3,929,604 | 12/1975 | Shirahata et al. | 427/39 X |
| 4,165,394 | 8/1979 | Ehrbar et al. | 427/40 |
| 4,199,623 | 4/1980 | Nuzzi et al. | 427/304 X |
| 4,250,225 | 2/1981 | Shirahata et al. | 427/40 X |

*Primary Examiner*—Michael R. Lusignan
*Attorney, Agent, or Firm*—James R. Hoatson, Jr.; Raymond H. Nelson; William H. Page, II

[57] ABSTRACT

The peel strength of metal-clad polymers may be increased by treating a polymer such as polysulfone with a gas plasma prior to the deposition of the metal thereon. The gas plasma is provided for by the introduction of a gas such as helium, argon, etc. over the surface of the polymer while said polymer is in an electric field in which the power may range from about 50 to about 15,000 watts.

10 Claims, No Drawings

METHOD FOR INCREASING THE PEEL STRENGTH OF METAL-CLAD POLYMERS

BACKGROUND OF THE INVENTION

Polymers which contain a coating of a metal, and particularly a conductive metal, find a wide variety of uses in the electronics field. For example, circuit boards are widely used in communication equipment, such as telephonic or video equipment. In many instances, where the particular piece of equipment is subjected to friction or wear, it is desirable that the metal which is bonded to the plastic polymeric substrate be able to withstand any deleterious effects which are caused by the aforesaid friction or wear. In this respect, it is necessary that the metal be firmly bonded to the substrate material in order to withstand any displacement which may occur and thus impair the efficiency of the particular piece of equipment or render the same useless.

As will hereinafter be shown in greater detail, a method for increasing the adhesive properties of metals to the substrate material has been discovered whereby the peel strength may be greatly increased and thus enhance the efficiency of the composite.

DETAILED DESCRIPTION OF THE INVENTION

This invention relates to a method for increasing the peel strength of metal-clad polymers. More specifically, the invention is concerned with a process for enhancing the adhesive properties of a polymeric material whereby an increased bond of metal to said polymeric substrate can be strengthened.

As hereinbefore set forth, the ability of metal to retain an intimate bond to polymeric substrates is a desirable feature in many electronic or electrical pieces of equipment. By utilizing the method of the present invention, it has been found that an increase in the bonding properties may be obtained with a concomitant increase in the peel strength of a metal-clad polymer or laminate. This increase, as will be hereinafter shown, is obtained by subjecting the polymeric substrate to a pre-treatment process prior to deposition of the metal on the surface of said polymer. The term "polymer" as used in the present specification and appended claims will refer to substrate materials which comprise either a single layer of a polymeric material or a multiplicity of layers of the polymeric material, either bonded together or containing a dissimilar material such as glass fibers interspersed between the layers or contained therein.

It is therefore an object of this invention to provide a method for increasing the peel strength of metal-clad polymers.

In one aspect, an embodiment of this invention resides in a process for increasing the peel strength of a metal-clad polymer which comprises subjecting a polymer to a gas plasma at treatment conditions, thereafter depositing a metal on the resultant treated polymer, and recovering the metal-clad polymer.

A specific embodiment of this invention is found in a process for increasing the peel strength of a metal-clad polymer which comprises subjecting a polymer comprised of polysulfone to a gas plasma, in which the gas which is present comprises helium at a temperature in the range of from about ambient to about the glass transition temperature of said polysulfone, a pressure in the range of from about 5 atmospheres to about $10^{-6}$ torr, and an electrical power of from about 50 to about 15,000 watts, thereafter depositing copper on the treated polysulfone polymer and recovering the copper-clad polysulfone.

Other objects and embodiments may be found in the following further detailed description of the present invention.

As hereinbefore set forth, the present invention is concerned with a process for obtaining improved peel strength of metal-clad polymers. The improvement in the peel strength is effected by treating a polymeric substance in a gas plasma prior to deposition of the metal on the surface of the polymer. A gas plasma is formed by the interaction of a gas with an electric field. For example, an electrical field may be provided for by a Radio Frequency Generator which will provide the necessary field for interaction with a gas of the type hereinafter set forth in greater detail to produce radical species primarily by electron induced dissociation. These sepcies will then interact with the outermost atomic layers of the polymeric material, whereby a stronger bond with a subsequently deposited metal can be achieved.

Examples of gases which may be utilized to form the gas plasma will include inert gases such as helium, argon, krypton, xenon, neon, radon, nitrogen, etc. as well as other gases such as oxygen, air, carbon monoxide, carbon dioxide, carbon tetrachloride, chloroform, hydrogen, etc., fluoridated gases which are commonly known as Freons including $CF_2$, $C_2F_6$, $CCl_2F_2$, $CClF_3$, $CCl_3F$, as well as mixtures of the aforesaid gases. Of the aforementioned gases, the preferred gases which are employed will include helium, argon and nitrogen. It is to be understood that the aforementioned list of gases is only representative of the type of gases which may be employed and that the present invention is not necessarily limited thereto.

Examples of polymers which may be treated with a gas plasma according to the process of this invention, will include polymers which are both thermoplastic and thermosetting in nature. Some specific examples of these polymers which may be used will include: ABS (acrylonitrile-butadienestyrene), acetals, acrylics, allylresins, butadienestyrene, cellulosic resins including cellulose propionate, cellulose acetate, cellulose nitrate, epoxy resins which may be filled with glass fibers or minerals, fluoroplastics such as polychlorotrifluoroethylene, polytetrafluoroethylene, polyvinylidenefluoride, melamine-formaldehyde resins, nylons such as nylon 6, nylon 6/6, nylon 6/12, nylon 11, nylon 12, phenol-formaldehyde, phenol-furfural, phenolic cast resins, phenoline oxide, polyamides, polyimides, polysulfone, polybutadienes, polybutylene, polycarbonates, polyesters, alkyds, polyethylenes, polypropylenes, polyphenaline sulfides, polystyrene, polyurethanes, vinyl polymers and co-polymers, etc. It is also to be understood that the aforementioned list of polymers which may be used as a single layer or which may be prepared as laminates is only representative of a class of polymers which may be employed, and that the present invention is not necessarily limited thereto.

The reaction conditions which are employed to treat the aforementioned polymers with a gas plasma will include a temperature which may range from about ambient (20°–25° C.) up to the glass transition or melting temperature of the particular polymer which is employed. For example, the temperature when treating thermoplastic polyesters may range from ambient up to about 267° C.; when treating ABS, the temperature may range from ambient up to about 120° C.; when treating polyamides, the temperature may range up to about 275° C.; when treating polyethylene, the temperature may range up to about 140° C.; when treating polysulfone, the temperature may range up to about 230° C. etc. Therefore, it is readily apparent that the particular temperature at which the treatment is effected will be dependent upon the particular polymer which is undergoing the aforesaid treatment. Other operating parameters which are employed in the process of this invention will include pressures which may range from superatmospheric, up to about 5 atmospheres, to subatmospheric pressures of about $10^{-6}$ torr, and an electric power which may be from various sources such as direct current (D.C.), alternating current (A.C.), audio frequency (A.F.), intermediate frequency (I.F.), radio frequency (R.F.), microwave frequency, etc., which will range from about 50 to about 15,000 watts. This power may be obtained from any source of electrical energy such as a generator. The treatment of the polymer with the gas plasma is effected for a period of time which may range from about 0.1 minute up to about 4 hours or more in duration. The time of treatment will be dependent upon the other operating conditions including temperature, pressure and power, and will be for a period of time sufficient to treat the surface of the laminate or polymer until said surface is more susceptible to the subsequent bonding procedure. It is contemplated within the scope of this invention that the deposition of metal on the surface of the laminate or polymer may be effected within a relatively short period of time subsequent to the gas plasma treatment or, if so desired, the plasma-treated polymer may be aged by exposure to the atmosphere for a period of time which may range up to about 8 weeks or more in duration in order to increase the adhesive properties of the polymer surface.

The deposition of the metal on the surface of the polymer may be accomplished by any means known in the art, utilizing such deposition or cladding procedures such as sputter deposition, electrolysis deposition, electrolytic deposition, evaporation, pressing, etc. Examples of metals which may be deposited on the surface of the polymer will include, in particular, conductive metals such as, but not limited to, copper, zinc, nickel, aluminum, silver, gold, iron, steel and alloys such as brass, Monel metal, molybdenum-tungsten alloys, aluminum-copper-gold alloys, etc. If so desired, the metal may be deposited on the surface of the polymer in varying thicknesses, said thicknesses ranging from about 0.01 to about 100 microns or more, the thickness of the metal being dependent upon the particular use to which the metal-clad polymer is to be applied.

The process of this invention may be effected in either a closed or open system. For example, when a closed system is employed, the polymer which is to be treated is placed in a closed chamber and the particular gas which is employed is passed into the chamber. The chamber will be maintained at pretreatment operating conditions of temperature and pressure, the operating parameters of which having been hereinbefore set forth. Thereafter, the chamber is subjected to a high electric field between two electrodes. A discharge is obtained, which is the gas plasma, and which consists of ions, free radicals, and metastables, the latter being forms which cannot exist outside of the electric field, except for a very short period of time. The plasma products are allowed to treat the surface of the polymer for a predetermined period of time whereby the surface of said polymer is modified and the adhesive property thereof is enhanced. Following the expiration of the reaction time, electric power is discontinued and the treated polymers are recovered. Following this, the plasma treated polymers are then clad with a metal by any one of the means hereinbefore set forth and recovered. The resulting metal-clad polymer will possess a peel strength greater than a metal-clad polymer in which the polymer has not been subjected to a gas plasma treatment prior to the deposition of the metal thereon.

It is also contemplated within the scope of this invention that the gas plasma treatment of the polymer may be effected in an open system in which the polymer to be treated is placed in an electric field between two electrodes, and subjected to the electric field while a gas of the type hereinbefore set forth is flowed over the surface of the polymer, said polymer being maintained at a pretreated operating temperature. Following the treatment of the polymer in an open system for a predetermined period of time, the modified polymer is then subjected to a metal deposition in a manner similar to that hereinbefore set forth, and recovered.

The following examples are given for the purposes of illustrating the process of the present invention and the improved peel strength of gas plasma treated polymers which had been metal-clad. However, it is to be understood that these examples are merely illustrative of the process, and that the present invention is not necessarily limited thereto.

EXAMPLE I

In this example, a polymer comprising polysulfone in the shape of a board, which was 9 inches by 3 inches by 0.062 inches in shape, was treated with a gas plasma by placing the polymer in a closed chamber. Helium gas was passed into the chamber while the gas was subjected to an electric field at a radio frequency (R.F.) power of 200 watts, while maintaining the pressure in the chamber at 1 torr. The board was treated for a period of one minute at this pressure following which the R.F. power was discontinued and the board was recovered. Two additional boards were treated in a similar manner, at identical conditions of pressure and R.F. power, for periods of 5 and 20 minutes respectively.

The three boards which were treated for the varying periods of time were then clad with copper by pressing 1 ounce T.C. copper foil (37 microns thickness) on the treated boards for a period of 15 minutes at a temperature of 220° C., under a pressure of 125 pounds per square inch. Following the cladding of the polysulfone board with the copper, the copper-clad polymers were recovered and a strip of tape $\frac{1}{8}$" wide was applied to the copper surface. The boards were then placed in a ferric chloride solution which etched off all of the copper except for that which was under the tape. Thereafter, the tape was removed, leaving a $\frac{1}{8}$" strip of copper bonded to the polysulfone.

The peel strength of the copper-clad polysulfone was determined by subjecting said clad polymer to a peel strength test using, as the instrument for said measurement a device known as an Instron. The sample to be tested was placed between two grips, one grip (a vacuum grip) holding the clad polymer, while the other grip held the copper foil. The peel strength was determined by moving the grip clasping the copper foil in a direction normal to the surface of the polymer at a constant cross head speed of 2" per minute. The force required to peel the copper from the surface of the polysulfone was automatically recorded by the instrument and the peel strength, which is measured in lbs./inch, was determined.

In addition to measuring the peel strength of the gas plasma-treated polymer, a fourth polymer comprising a polysulfone board, which had not been treated with a gas plasma prior to metal-cladding, was prepared in which the copper foil was pressed to the board under similar conditions of temperature, pressure and time as hereinbefore set forth. The results of the four tests are set forth in Table I below in which the polysulfone which was treated with the helium gas plasma for 1 minute at 200 watts R.F. power was designated as A, the polysulfone which was treated with the helium gas plasma for a period of 5 minutes at 200 watts R.F. power was designated as B, the polysulfone which was treated for a period of 20 minutes at 200 watts R.F. power was designated as C, and the nontreated polysulfone was designated as D.

TABLE I

| LAMINATE | PEEL STRENGTH LBS./IN. |
| --- | --- |
| A | 5.25 |
| B | 7.9 |
| C | 9.9 |
| D | 5.5 |

EXAMPLE II

In this example, polysulfone boards were treated with a helium gas plasma in a manner similar to that hereinbefore set forth, that is, the polysulfone boards were exposed to a helium gas plasma for periods of time including 1, 5, and 20 minutes, utilizing a pressure of 1 torr and an R.F. power of 200 watts. The three boards, along with an untreated board, were aged by exposure to the atmosphere prior to metal-cladding the boards for a period ranging from 1, 2 and 4 weeks. After aging for the three periods, the boards were then clad with 1 oz. T.C. copper foil (37 microns in thickness) for a period of 15 minutes at a temperature of 220° C. under a pressure of 125 psi. After cladding the untreated board and treated boards, the boards were then subjected to a peel strength test similar to that hereinbefore discussed in Example I above. The results of these tests are set forth in Table II below.

TABLE II

| Time in Minutes He Plasma Treating | Aging Period Weeks | Peel Strength lbs./in. |
| --- | --- | --- |
| 0 | 0 | 5.5 |
| 1 | 0 | 5.0 |
| 5 | 0 | 8.0 |
| 20 | 0 | 10.0 |
| 0 | 1 | 5.5 |
| 1 | 1 | 6.2 |
| 5 | 1 | 8.2 |
| 20 | 1 | 9.2 |
| 0 | 2 | 5.5 |
| 1 | 2 | 6.6 |
| 5 | 2 | 9.0 |
| 20 | 2 | 9.2 |
| 0 | 4 | 5.5 |
| 1 | 4 | 6.2 |
| 5 | 4 | 8.2 |
| 20 | 4 | 8.5 |

It is evident from the above Table that the boards which were not subjected to a gas plasma treating exhibited a peel strength of only 5.5 lbs. per inch even after having been aged for a period of up to 4 weeks. In contradistinction to this, polysulfone boards which were treated with a helium plasma all evidenced greater peel strength, especially those boards which had been treated with the helium plasma for a period of 5 minutes and 20 minutes.

EXAMPLE III

In a manner similar to the process set forth in Example I and II above, a laminate comprising a polyimide may be placed in a closed chamber. The chamber may then be heated to a temperature of 50° C. and argon charged to the chamber. An electric field, which may have an R.F. power of about 100 watts is passed through the chamber which is maintained at an operating pressure of 2 atmospheres. After passage of the argon gas through the electric field for a period of 5 minutes, introduction of the gas may be discontinued as well as discontinuing the electric field. The treated polyimide laminate may be recovered and a film of nickel may be deposited thereon, utilizing an electroless deposition. The peel strength of the metal which is deposited on the surface of the laminate should be greater than the peel strength of a nickel-clad polyimide in which the polyimide has not been subjected to treatment with a gas plasma.

EXAMPLE IV

The treatment of a polymer comprising polyethylene with a gas plasma, which is provided for by the introduction of nitrogen into a closed chamber containing the aforesaid polyethylene utilizing an R.F. power of about 500 watts while maintaining the pressure of the chamber at about 1 torr for a period of 20 minutes and thereafter cladding the treated polymer with a brass foil, may produce a metal-clad polymer in which the peel strength is considerably greater than that which is possessed by a brass-clad polyethylene polymer in which the polyethylene has not been treated with a gas plasma prior to deposition of the brass thereon.

In like manner, a glass epoxy laminate may be treated with a gas plasma provided for by the introduction of carbon tetrachloride into a closed chamber at a pressure of 1 torr and a temperature of 75° C. for a period of 20 minutes. After recovery of the treated glass epoxy laminate, it may then be clad with aluminum by subjecting the treated laminate and aluminum foil to a pressure of about 125 psi at a temperature of about 300° C. The peel strength of the aluminum-clad epoxy should be greater than the peel strength of an aluminum-clad glass epoxy laminate in which the laminate has not been pretreated with a gas plasma prior to having the aluminum placed thereon.

I claim as my invention:

1. A process for increasing the peel strength of a metal-clad polysulfone polymer which comprises subjecting said polysulfone polymer to a gas plasma comprising the presence of a treatment gas and an electrical field generated from an electrical power of from about 50 to about 15000 watts, at a temperature of from about ambient to about the glass transition temperature of said polysulfone polymer and a pressure in the range of from about 5 atmospheres to about $10^{-6}$ torr for a period of time ranging from about 5 minutes to about 4 hours and thereafter depositing a metal on the resultant treated polysulfone polymer and thereafter recovering the metal-clad polysulfone polymer possessing increased peel strength.

2. The process as set forth in claim 1 in which the treatment gas in said gas plasma is helium.

3. The process as set forth in claim 1 in which the treatment gas in said plasma is argon.

4. The process as set forth in claim 1 in which the treatment gas in said gas plasma is nitrogen.

5. The process as set forth in claim 1 in which the treatment gas in said gas plasma is carbon tetrafluoride.

6. The process as set forth in claim 1 in which said metal is copper.

7. The process as set forth in claim 1 in which said metal is brass.

8. The process as set forth in claim 1 in which said metal is nickel.

9. The process as set forth in claim 1 in which said metal is aluminum.

10. The process as set forth in claim 1 in which said metal is zinc.

* * * * *